United States Patent
Yoo et al.

(10) Patent No.: US 8,331,174 B2
(45) Date of Patent: Dec. 11, 2012

(54) SEMICONDUCTOR MEMORY DEVICE AND METHOD FOR OPERATING THE SAME

(75) Inventors: Seong Nyuh Yoo, Gyeonggi-do (KR); Duck Hwa Hong, Gyeonggi-do (KR); Saeng Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 196 days.

(21) Appl. No.: 12/833,819

(22) Filed: Jul. 9, 2010

(65) Prior Publication Data

US 2011/0242917 A1 Oct. 6, 2011

(30) Foreign Application Priority Data

Mar. 30, 2010 (KR) .......................... 10-2010-0028646

(51) Int. Cl.
 *G11C 29/00* (2006.01)
(52) U.S. Cl. ................ 365/200; 365/230.03; 365/230.06
(58) Field of Classification Search .................. 365/200, 365/230.03, 230.06, 185.11, 185.09, 185.18, 365/201, 63, 189.01, 185.23, 185.22
See application file for complete search history.

(56) References Cited

U.S. PATENT DOCUMENTS

2004/0218431 A1* 11/2004 Chung et al. ................... 365/200
2010/0188915 A1* 7/2010 Ahn et al. ...................... 365/222

FOREIGN PATENT DOCUMENTS

JP 2000-21190 1/2000

OTHER PUBLICATIONS

Notice of Preliminary Rejection issued from Korean Intellectual Property Office on May 20, 2011.

* cited by examiner

*Primary Examiner* — Dang Nguyen
(74) *Attorney, Agent, or Firm* — IP & T Group LLP

(57) ABSTRACT

A semiconductor memory device includes: a repair address generation unit configured to generate a repair address signal in response to a first address signal; a line choice address generation unit configured to generate a line choice address signal by combining the first address signal and the repair address signal according to a determination as to whether the repair address signal is to be used; and a cell line decoding unit configured to select one of a normal cell region and a redundancy cell region according to the determination, and select one of a plurality of local cell lines provided in the selected cell region in response to the line choice address signal.

22 Claims, 8 Drawing Sheets

FIG. 5
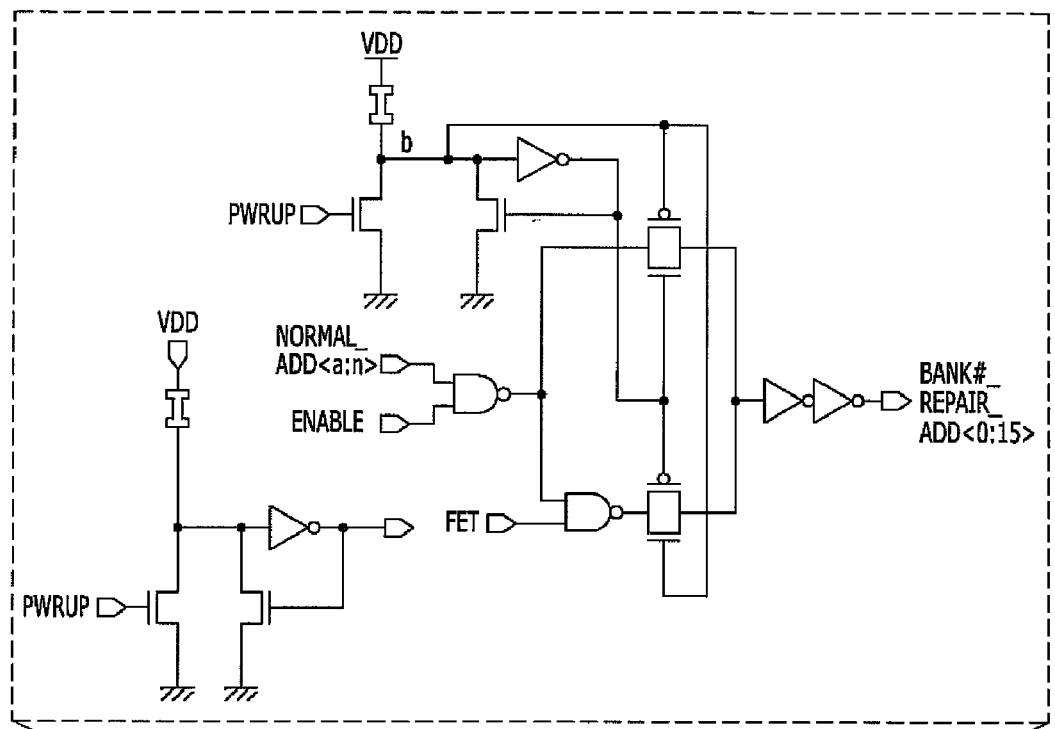
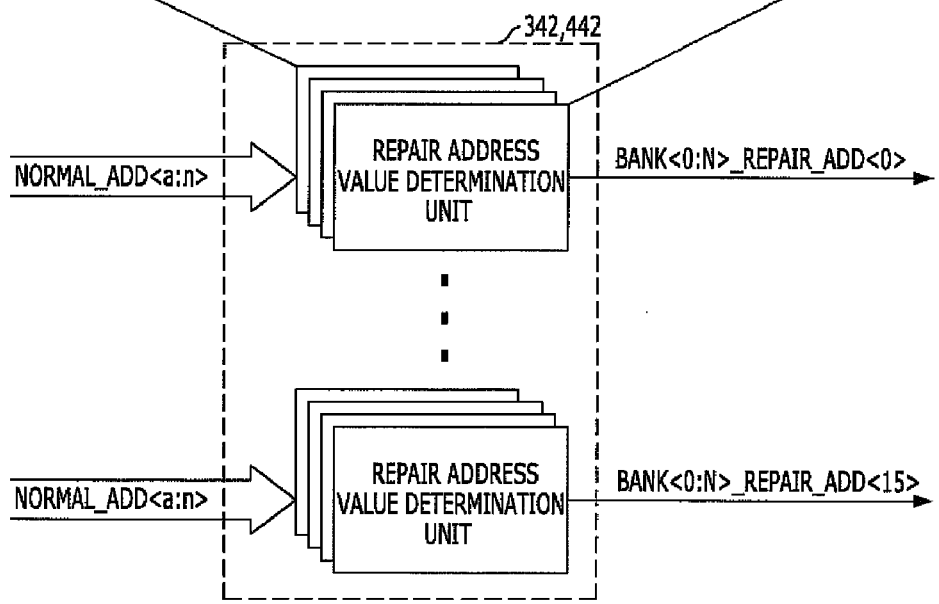

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2010-0028646, filed on Mar. 30, 2010, which is incorporated herein by reference in its entirety.

BACKGROUND OF THE INVENTION

Exemplary embodiments of the present invention relate to a semiconductor design technology, and more particularly, to a circuit and method for transferring an address signal in a semiconductor memory device.

Semiconductor memory devices, such as a dynamic random access memory (DRAM), often include a redundancy circuit which replaces a defective memory cell with a redundancy memory cell, thereby improving the yield of the devices.

FIG. 1 is a layout block diagram illustrating a repair operation of a conventional semiconductor memory device.

Referring to FIG. 1, the conventional semiconductor memory device includes a plurality of banks (BANK 0, BANK 1, ..., BANK N) 10, a plurality of repair address generation unit 30, and a plurality of cell line decoding units 20. Each of the banks (BANK 0, BANK 1, ..., BANK N) 10 includes a normal cell region and a redundancy cell region. The repair address generation units 30 are configured to generate repair address signals BANK<0:N>_REPAIR_ADD<0:15> in response to normal address signal BANK<0:N>_NORMAL_ADD<a:n>, and generate repair address use judgment signals BANK<0:N>_REPAIR_USE_JUDG whose values are determined according to whether the generated repair address signals BANK<0:N>_REPAIR_ADD<0:15> are to be used. When the repair address use judgment signals BANK<0:N>_REPAIR_USE_JUDG are deactivated, the cell line decoding units 20 selectively drive one of a plurality of local cell lines BANK<0:N>_NORMAL_CELL_LINE<0:$2^N$>, which are provided in the normal cell regions of banks corresponding to the normal address signals BANK<0:N>_NORMAL_ADD<a:n> among the plurality of banks (BANK 0, BANK 1, ..., BANK N) 10. When the repair address use judgment signals BANK<0:N>_REPAIR_USE_JUDG are activated, the cell line decoding units 20 selectively drive one of a plurality of local cell lines BANK<0:N>_REPAIR_CELL_LINE<0:15>, which are provided in the redundancy cell regions of banks corresponding to the normal address signals BANK<0:N>_NORMAL_ADD<a:n> among the plurality of banks (BANK 0, BANK 1, ..., BANK N) 10, according to the repair address signals BANK<0:N>_REPAIR_ADD<0:15>.

The normal address signals BANK<0:N>_NORMAL_ADD<a:n> may be directly inputted to the plurality of cell line decoding units 20 coupled to the plurality of banks (BANK 0, BANK 1, ..., BANK N) 10, or may pass through the plurality of repair address generation units 30 and be inputted to the cell line decoding units 20 as the repair address signals BANK<0:N>_REPAIR_ADD<0:15> and the repair address use judgment signals BANK<0:N>_REPAIR_USE_JUDG.

In addition, the repair address generation units 30 are disposed close to the banks 10 and the cell line decoding units 20, and transfer the repair address signals BANK<0:N>_REPAIR_ADD<0:15> and the repair address use judgment signals BANK<0:N>_REPAIR_USE_JUDG generated in response to the normal address signals BANK<0:N>_NORMAL_ADD<a:n>.

In this case, lines for transferring the normal address signals BANK<0:N>_NORMAL_ADD<a:n> directly inputted to the cell line decoding units 20 coupled to the banks 10 are disposed in such a manner that they do not overlap the regions where the repair address generation units 30 are disposed. Such an arrangement prevents/reduces interference with normal operation of a plurality of fuse circuits which may be provided inside the repair address generation units 30.

That is, after the semiconductor memory device is fabricated, the fuse circuit provided in the semiconductor memory device determines in a test operation whether or not to cut fuses. At this time, if lines cross over or other circuits are present over the regions overlapped with the regions where the fuse circuits are disposed, a normal test cannot be performed. Therefore, according to an example, no circuits and lines are disposed over the regions overlapped with the regions where the fuse circuits are disposed.

Such a layout of the conventional semiconductor memory device may be efficiently used when the number of lines for transferring the normal address signals BANK<0:N>_NORMAL_ADD<a:n> is not large, and the integration density of the semiconductor memory devices is relatively low.

However, as the capacity and integration density of the semiconductor memory devices increase, modifications to the above-described semiconductor memory devices are desired.

For example, FIG. 2 is a layout block diagram illustrating a repair operation of a conventional semiconductor memory device.

Referring to FIG. 2, an overall configuration is substantially identical to that corresponding to the layout of the semiconductor memory device of FIG. 1.

That is, the semiconductor memory device includes a plurality of banks (BANK 0, BANK 1, ..., BANK N) 10, a repair address generation unit 40, and a plurality of cell line decoding units 20.

However, only one repair address generation unit 40 is separately disposed in an independent region of the semiconductor memory device, without regard to the banks 10 and the cell line decoding units 20, as opposed to the case in which the plurality of repair address generation units 30 are disposed close to the banks 10 and the cell line decoding units 20, as shown in FIG. 1.

That is, the plurality of repair address generation units 40 corresponding to the plurality of banks (BANK 0, BANK 1, ..., BANK N) 10 are collectively located at a region to thereby provide a single repair address generation unit 40. In this way, the region where a single repair address generation unit 40 is disposed can be selected as not to overlap with the region over which the normal address signals BANK<0:N>_NORMAL_ADD<a:n> are transferred to the banks 10 and the cell line decoding units 20. Thus, the normal address signals BANK<0:N>_NORMAL_ADD<a:n> can be stably transmitted to the banks 10 and the cell line decoding units 20 while using less space.

In the layout of the conventional semiconductor memory device of FIG. 2, the region over which the single repair address generation unit 40 does not to overlap the region over which the normal address signals BANK<0:N>_NORMAL_ADD<a:n> are transferred. However, relatively long transmission lines are used in transferring the repair address signals BANK<0:N>_REPAIR_ADD<0:15> and the repair address use judgment signals BANK<0:

N>_REPAIR_USE_JUDG from the repair address generation unit 30 to the banks 10 and the cell line decoding units 20. It is noted that, in FIG. 2, the length of transmission lines from the single repair address generation unit 40 disposed in a peripheral region to the banks 10 and the cell line decoding units 20 disposed in a core region is not proportionally depicted due to the limited space for the drawings. The actual length of transmission lines from the peripheral region to the core region is significantly longer than the length of transmission lines used to transfer the normal address signals BANK<0:N>_NORMAL_ADD<a:n> within the core region.

If there was only one bank 10, the length of transmission lines for transferring the repair address signals BANK<0:N>_REPAIR_ADD<0:15> and the repair address use judgment signals BANK<0:N>_REPAIR_USE_JUDG from the repair address generation unit 30 to the banks 10 and the cell line decoding units 20 do not raise a significant concern.

However, as illustrated in FIGS. 1 and 2, the plurality of banks (BANK 0, BANK 1, . . . , BANK N) 10 may be present in the semiconductor memory device, and therefore, the transmission lines for transmitting the repair address signals BANK#_REPAIR_ADD<0:15> and the repair address use judgment signals BANK#_REPAIR_USE_JUDG are to be provided in each bank. Consequently, the size of the semiconductor memory device is increased. For the purpose of this disclosure, "#" is one value ranging from 0 to N.

More specifically, in the conventional semiconductor memory device of FIG. 2, the transmission lines for receiving the repair address signals BANK<0:N>_REPAIR_ADD<0:15> and the repair address use judgment signals BANK<0:N>_REPAIR_USE_JUDG raise more concerns than the transmission lines for receiving the normal address signals BANK<0:N>_NORMAL_ADD<a:n> for the following reasons.

First, since the normal address signals NORMAL_ADD<a:n> also contain information for selecting one of the plurality of banks (BANK 0, BANK 1, . . . , BANK N) 10, the plurality of banks (BANK 0, BANK 1, . . . , BANK N) 10 can share the transmission lines for receiving the normal address signals BANK#_NORMAL_ADD<a:n> after performing the operation of pre-decoding the normal address signals NORMAL_ADD<a:n>. Therefore, "n−a+1" transmission lines are required for transferring the normal address signals BANK<0:N>_NORMAL_ADD<a:n> to the plurality of banks (BANK 0, BANK 1, . . . , BANK N) 10.

On the other hand, the repair address signals BANK<0:N>_REPAIR_ADD<0:15> and the repair address use judgment signals BANK<0:N>_REPAIR_USE_JUDG are specific to each of the plurality of banks (BANK 0, BANK 1, . . . , BANK N) 10, and they are transferred to the respective banks through respective transmission lines. Therefore, "(15+1)×N" transmission lines are required in order to transfer the repair address signals BANK<0:N>_REPAIR_ADD<0:15> and the repair address use judgment signals BANK<0:N>_REPAIR_USE_JUDG to the plurality of banks (BANK 0, BANK 1, . . . , BANK N) 10. The value of "N" may increase as the number of the banks increases.

Therefore, in the case of devices having a large number of banks, the integration density of the devices are reaching limits.

SUMMARY OF THE INVENTION

An embodiment of the present invention is directed to a circuit and method for efficiently transferring normal address signals and redundancy address signals within a semiconductor memory device including a normal cell region and a redundancy cell region.

In accordance with an embodiment of the present invention, a semiconductor memory device includes: a repair address generation unit configured to generate a repair address signal in response to a first address signal; a line choice address generation unit configured to generate a line choice address signal by combining the first address signal and the repair address signal according to a determination as to whether the repair address signal is to be used; and a cell line decoding unit configured to select one of a normal cell region and a redundancy cell region according to the determination and select one of a plurality of local cell lines provided in the selected cell region in response to the line choice address signal.

In accordance with another embodiment of the present invention, a semiconductor memory device includes: a plurality of banks including normal cell regions and redundancy cell regions; a repair address generation unit configured to generate a repair address signal in response to a first address signal; a line choice address generation unit configured to generate a line choice address signal by combining the first address signal and the repair address signal according to a determination as to whether the repair address signal is to be used; and a plurality of cell line decoding unit configured to select one of the normal cell regions and the redundancy cell regions provided in the plurality of banks in response to the line choice address signal, and select one of a plurality of local cell lines provided in the selected cell region.

In accordance with yet another embodiment of the present invention, a method for operating a semiconductor memory device includes: generating a repair address signal in response to a first address signal; judging whether the repair address signal is to be used; selectively driving a plurality of local cell lines provided in a redundancy cell region by using a line choice address signal generated by combining the first address signal and the repair address signal when it is determined that the repair address signal is to be used; and selectively driving the plurality of local cell lines provided in the normal cell region by using the first address signal when it is judged that the repair address signal is not to be used.

BRIEF DESCRIPTION OF THE DRAWINGS

FIG. 5 is a detailed circuit diagram illustrating repair address generation units in the semiconductor memory devices of FIGS. 3 and 4 in accordance with an exemplary embodiment of the present invention.

DESCRIPTION OF SPECIFIC EMBODIMENTS

Figure 1:
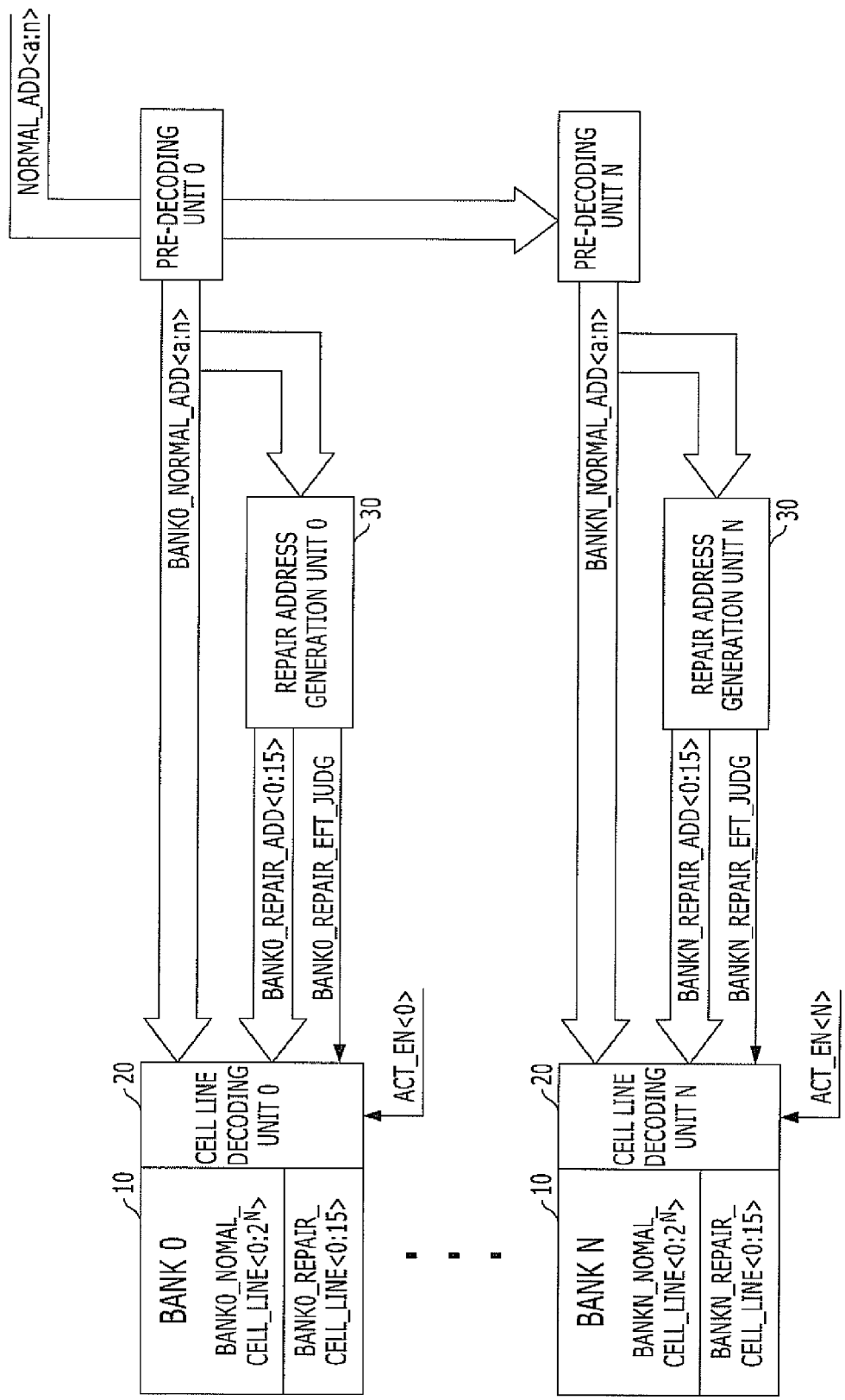
FIG. 1 is a layout block diagram illustrating a repair operation of a conventional semiconductor memory device.
Figure 2:
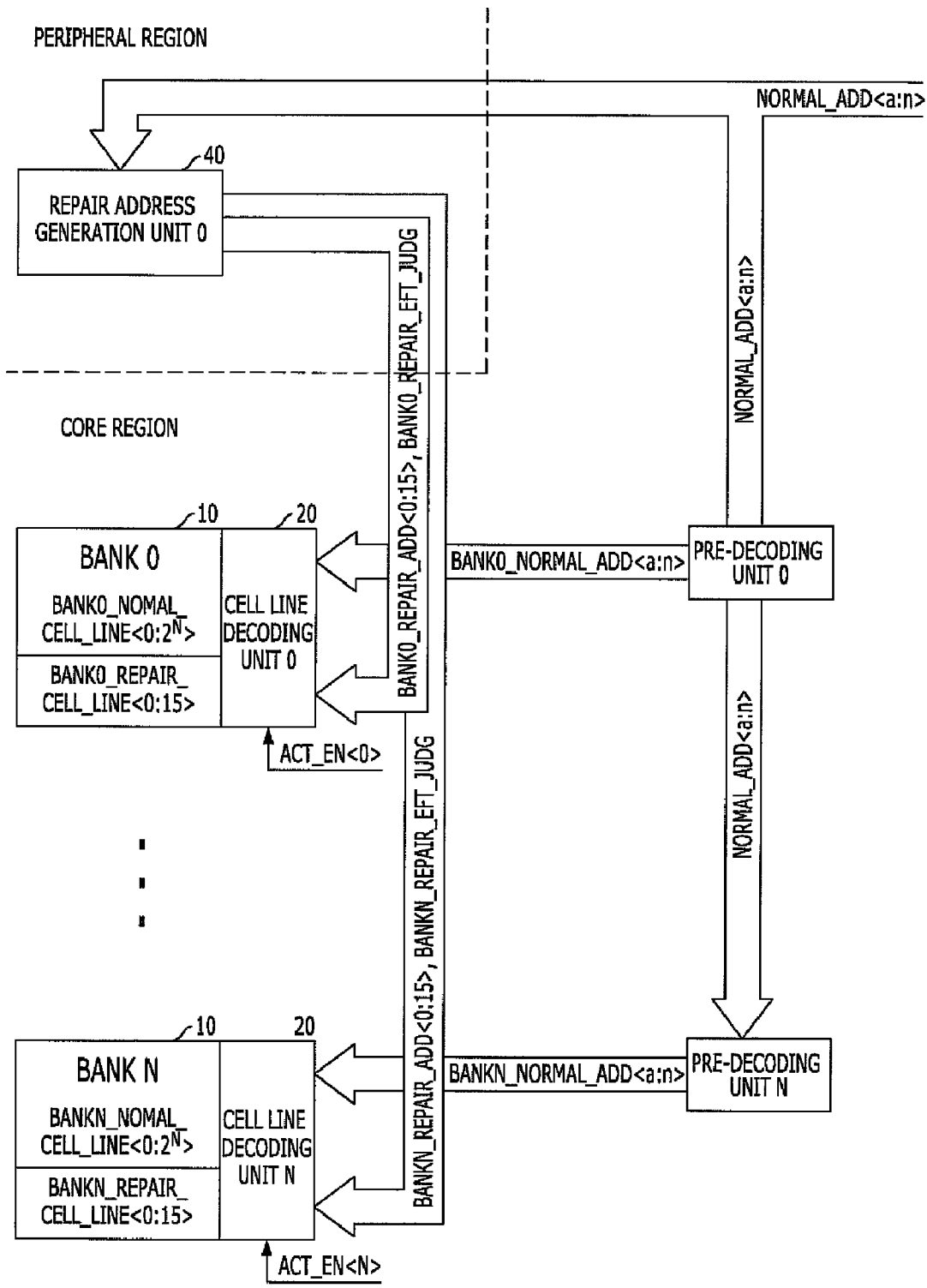
FIG. 2 is a layout block diagram illustrating a repair operation of a conventional semiconductor memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
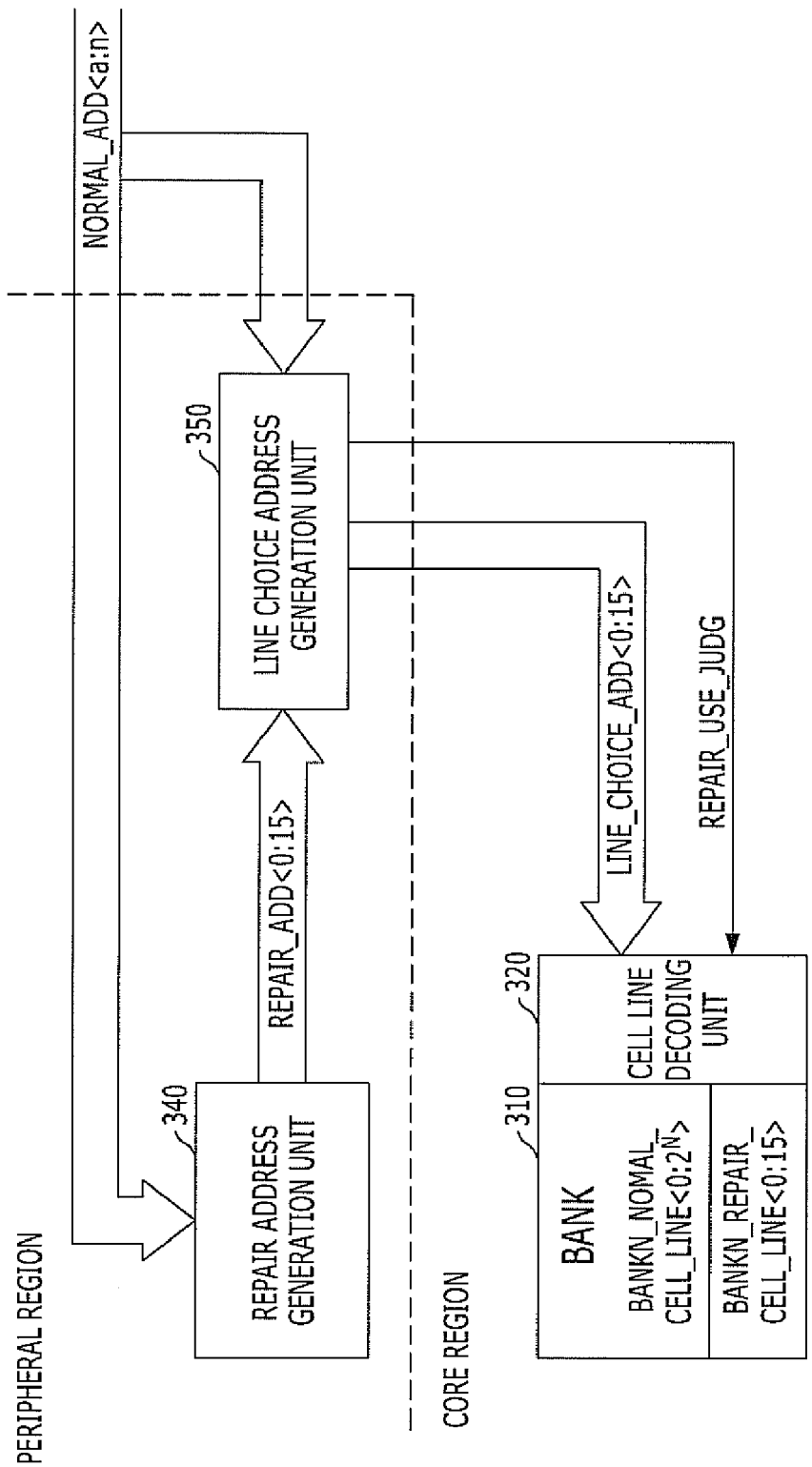
FIG. 3 is a layout block diagram illustrating a repair operation of a semiconductor memory device having a normal cell region and a redundancy cell region in accordance with an embodiment of the present invention.

FIG. 3 is a layout block diagram illustrating a repair operation of a semiconductor memory device having a normal cell region and a redundancy cell region in accordance with an embodiment of the present invention.

Referring to FIG. 3, the semiconductor memory device having the normal cell region and the redundancy cell region in accordance with the embodiment of the present invention includes a repair address generation unit 340, a line choice address generation unit 350, and a cell line decoding unit 320. The repair address generation unit 340 is configured to generate repair address signals REPAIR_ADD<0:15> in response to normal address signals NORMAL_ADD<a:n>. The line choice address generation unit 350 is configured to generate line choice address signals LINE_CHOICE_ADD<a:15> by combining the normal address signals NORMAL_ADD<a:n> and the repair address signals REPAIR_ADD<0:15> according to whether the repair address signals REPAIR_ADD<0:15> are to be used. The cell line decoding unit 320 is configured to select one of the normal cell region and the redundancy cell region according to whether the repair address signals REPAIR_ADD<0:15> are to be used, and select one of a plurality of local cell lines NORMAL_CELL_LINE<0:$2^N$> or REPAIR_CELL_LINE<0:15> provided in the selected cell region in response to the line choice address signals LINE_CHOICE_ADD<a:n>.

When it is determined that the repair address signals REPAIR_ADD<0:15> are to be used, the line choice address generation unit 350 combines the normal address signals NORMAL_ADD<a:n> and the repair address signals REPAIR_ADD<0:15> and outputs the line choice address signals LINE_CHOICE_ADD<a:15>.

On the other hand, when it is determined that the repair address signals REPAIR_ADD<0:15> are not to be used, the line choice address generation unit 350 directly outputs the normal address signals NORMAL_ADD<a:n> as the line choice address signals LINE_CHOICE_ADD<a:15>.

When it is determined that the repair address signals REPAIR_ADD<0:15> are to be used, the cell line decoding unit 320 selectively drives the plurality of local cell lines REPAIR_CELL_LINE<0:15> provided in the redundancy cell region by using the line choice address signals LINE_CHOICE_ADD<a:15>.

On the other hand, when it is determined that the repair address signals REPAIR_ADD<0:15> are not to be used, the cell line decoding unit 320 selectively drives the plurality of local cell lines NORMAL_CELL_LINE<0:$2^N$> provided in the normal cell region by using the line choice address signals LINE_CHOICE_ADD<a:n>.

Figure 4:
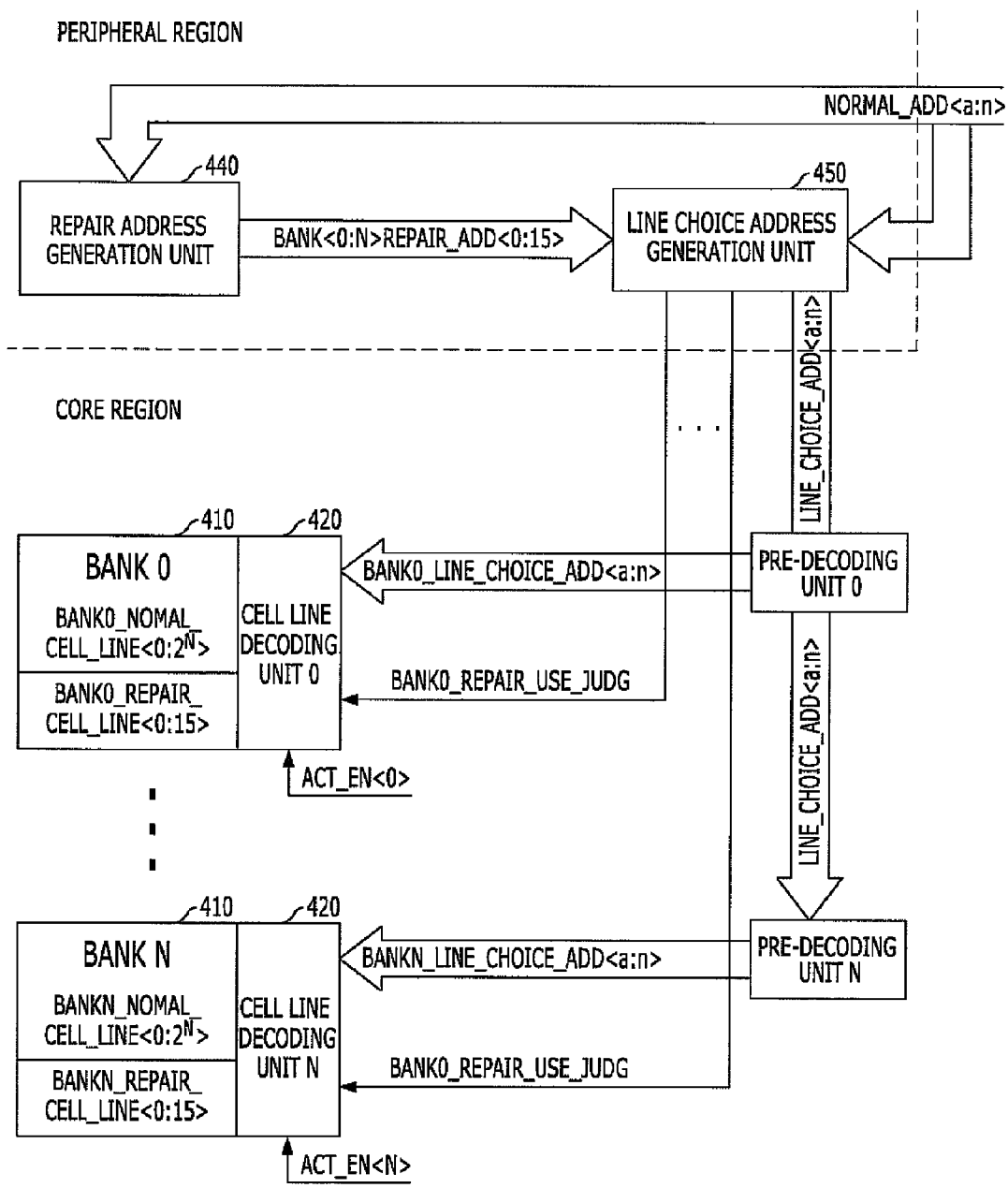
FIG. 4 is a layout block diagram illustrating a repair operation of a semiconductor memory device including a plurality of banks each having a normal cell region and a redundancy cell region in accordance with an embodiment of the present invention.

FIG. 4 is a layout block diagram illustrating a repair operation of a semiconductor memory device including a plurality of banks each having a normal cell region and a redundancy cell region in accordance with an embodiment of the present invention.

Referring to FIG. 4, the semiconductor memory device including a plurality of banks (BANK 0, BANK 1, . . . , BANK N) 410 each having the normal cell region and the redundancy cell region in accordance with an exemplary embodiment of the present invention includes a repair address generation unit 440, a line choice address generation unit 450, and a cell line decoding unit 420. The repair address generation unit 440 is configured to generate repair address signals BANK<0:N>_REPAIR_ADD<0:15> in response to normal address signals BANK<0:N>_NORMAL_ADD<a:n>. The line choice address generation unit 450 is configured to generate line choice address signals BANK<0:N>_LINE_CHOICE_ADD<a:n> by combining the normal address signals BANK<0:N>_NORMAL_ADD<a:n> and the repair address signals BANK<0:N>_REPAIR_ADD<0:15> according to whether the repair address signals BANK<0:N>_REPAIR_ADD<0:15> are to be used. The cell line decoding unit 420 is configured to select one of the normal cell region and the redundancy cell region provided in the plurality of banks (BANK 0, BANK 1, . . . , BANK N) 410 in response to the line choice address signals BANK<0:N>_LINE_CHOICE_ADD<a:n>, and select one of a plurality of local cell lines BANK<0:N> NORMAL_CELL_LINE<0:$2^N$> or BANK<0:N>_REPAIR_CELL_LINE<0:15> provided in the selected cell region.

When it is determined that the repair address signals BANK<0:N>_REPAIR_ADD<0:15> are to be used, the line choice address generation unit 450 outputs the line choice address signals BANK<0:N>_LINE_CHOICE_ADD<a:n> by combining the normal address signals BANK<0:N>_NORMAL_ADD<a:n> and the repair address signals BANK<0:N>_REPAIR_ADD<0:15>.

On the other hand, when it is determined that the repair address signals BANK<0:N>_REPAIR_ADD<0:15> are not to be used, the line choice address generation unit 450 directly outputs the normal address signals BANK<0:N>_NORMAL_ADD<a:n> as the line choice address signals BANK<0:N>_LINE_CHOICE_ADD<a:n>.

When it is determined that the repair address signals BANK<0:N>_REPAIR_ADD<0:15> are to be used, the cell line decoding unit 420 selectively drives one of the local cell lines BANK<0:N>_REPAIR_CELL_LINE<0:15>, which are provided in the redundancy cell region of a bank corresponding to the line choice address signal BANK#_LINE_CHOICE_ADD<a:n> among the plurality of banks (BANK 0, BANK 1, . . . , BANK N) 410, in response to the line choice address signal BANK#_LINE_CHOICE_ADD<a:n>. For reference, "#" can be any value ranging from 0 to N.

On the other hand, when it is determined that the repair address signals BANK<0:N>_REPAIR_ADD<0:15> are not to be used, the cell line decoding unit 420 selectively drives one of the local cell lines BANK<0:N>_NORMAL_CELL_LINE<0:$2^N$>, which are provided in the normal cell region of a bank corresponding to the line choice address signal BANK#_LINE_CHOICE_ADD<a:n> among the plurality of banks (BANK 0, BANK 1, ..., BANK N) 410, in response to the line choice address signal BANK#_LINE_CHOICE_ADD<a:n>.

The semiconductor memory device of FIG. 4 has a configuration substantially similar to that of the semiconductor memory device of FIG. 3, except that the plurality of banks (BANK 0, BANK 1, ..., BANK N) 10 are provided.

More specifically, the semiconductor memory device of FIG. 4 in accordance with an exemplary embodiment of the present invention includes the transmission lines for inputting the line choice address signals BANK#_LINE_CHOICE_ADD<a:n> and the repair address use judgment signals BANK<1>_REPAIR_USE_JUDG in each of the plurality of banks (BANK 0, BANK 1, ..., BANK N) 410.

In particular, in the semiconductor memory device in accordance with the embodiment of the present invention, the line choice address signals BANK<0:N>_LINE_CHOICE_ADD<a:n> contain information for selecting one of the plurality of banks (BANK 0, BANK 1, ..., BANK N) 410, similar to the normal address signals BANK<0:N>_NORMAL_ADD<a:n>. Therefore, as illustrated in FIG. 4, the plurality of banks (BANK 0, BANK 1, ..., BANK N) 410 can share the transmission lines for receiving the line choice address signals BANK#_LINE_CHOICE_ADD<a:n> through a pre-decoding operation. Hence, in the semiconductor memory device in accordance with an exemplary embodiment of the present invention, "n−a+2" transmission lines are used for receiving both the normal address information and the redundancy address information in each of the plurality of banks (BANK 0, BANK 1, ..., BANK N) 410.

Here, "BANK#" in the repair address signals BANK#_REPAIR_ADD<0:15> means that the redundancy cell regions included in the plurality of banks (BANK 0, BANK 1, ..., BANK N) 410 can be selected according to the repair address signals BANK#_REPAIR_ADD<0:15>.

With "#" in the repair address signals BANK#_REPAIR_ADD<0:15> varying from "0" to "N", any redundancy cell region included in any bank among the plurality of banks (BANK 0, BANK 1, ..., BANK N) 410 may be selected.

For example, when the repair address signals BANK#_REPAIR_ADD<0:15> are set to select sixteen repair address lines, they may be set to select eight repair address lines in the redundancy cell region included in a bank BANK 0 (BANK0_REPAIR_ADD<0:7>), and select eight repair address lines in the redundancy cell region included in a bank BANK 1 (BANK1_REPAIR_ADD<8:15>).

Likewise, when the repair address signals BANK#_REPAIR_ADD<0:15> are set to select sixteen repair address lines, they may be set to select two repair address lines in the redundancy cell region included in the bank BANK 0 (BANK0_REPAIR_ADD<0:1>), select eight repair address lines in the redundancy cell region included in the bank BANK 1 (BANK1_REPAIR_ADD<3:11>), and select four repair address lines in the redundancy cell region included in a bank BANK 2 (BANK2_REPAIR_ADD<12:15>).

FIG. 5 is a detailed circuit diagram illustrating the repair address generation units in the semiconductor memory devices of FIGS. 3 and 4 in accordance with the embodiments of the present invention.

Referring to FIG. 5, the repair address generation units 340 and 440 included in the semiconductor memory devices in accordance with the embodiments of the present invention determine respective bit values of the repair address signals BANK<0:N>_REPAIR_ADD<0:15> in response to the normal address signals NORMAL_ADD<a:n>.

More specifically, the normal address signals NORMAL_ADD<a:n> contain sufficient information for selecting the plurality of local cell lines BANK<0:N>_NORMAL_CELL_LINE<0:$2^N$> provided in the normal cell region of a selected one of the plurality of banks (BANK 0, BANK 1, ..., BANK N) 410. In this case, when one of the plurality of local cell lines BANK<0:N>_NORMAL_CELL_LINE<0:$2^N$> provided in the normal cell region is determined to be defective by performing a test, fuse sets in the repair address generation units 340 and 440 are set to be identical to the value of the normal address signal corresponding to the local cell line which is determined to be defective.

For example, when the value of the 16-bit normal address signal NORMAL_ADD<0:15> corresponding to the local cell line determined to be defective among the plurality of local cell lines BANK<0:N>_NORMAL_CELL_LINE<0:$2^N$> provided in the normal cell region is "0 0 1 0 1 0 1 0 1 1 1 0 1 1 1 0", the fuse sets provided in the repair address generation units 340 and 440 receive the value of the 16-bit normal address signal NORMAL_ADD<0:15>, that is, "0 0 1 0 1 0 1 1 1 0 1 1 1 0", but are set so that a value of "0 0 0 0 0 0 0 0 0 0 0 0 0 0 0 0" or a value of "1 1 1 1 1 1 1 1 1 1 1 1 1 1 1 1" is outputted from only one fuse set. In this case, the repair address signals BANK<0:N>_REPAIR_ADD<0:15> corresponding to the fuse set which outputs the value of "0 0 0 0 0 0 0 0 0 0 0 0 0 0 0 0" or the value of "1 1 1 1 1 1 1 1 1 1 1 1 1 1 1 1" become addresses which select the redundancy cell line corresponding to the local cell line determined to be defective among the plurality of local cell lines BANK<0:N>_NORMAL_CELL_LINE<0:$2^N$> provided in the normal cell region.

As such, the fuse sets provided in the repair address generation units 340 and 440 include a plurality of fuse circuits configured to receive a total number of the addresses equal to the bit number (n−a+1) of the normal address signal NORMAL_ADD<a:n>. A total number of the fuse sets provided in the repair address generation units 340 and 440 is equal to {number of banks (N+1)×number (k) of redundancy lines in each bank}.

For example, when a total of four banks BANK0 to BANK3 are provided in the semiconductor memory device and sixteen redundancy lines are present in each bank, 64 (=16×4) fuse sets are provided in the repair address generation units 340 and 440 of the semiconductor memory device in order to select all of the sixteen redundancy lines present in each bank. As to a determination of a total number of fuse circuits in each fuse set, when the 16-bit normal address signal NORMAL_ADD<0:15> is inputted to the semiconductor memory device, sixteen fuse circuits are included in each fuse set of the repair address generation units 340 and 440. Therefore, a total number of the fuse circuits provided in the repair address generation units 340 and 440 is equal to 1024 (=64×16).

Likewise, when a total of four banks BANK 0 to BANK 3 are provided in the semiconductor memory device and thirty-two redundancy lines are present in each bank, 128 (=32×4) fuse sets are provided in the repair address generation units 340 and 440 of the semiconductor memory device and allows a selection among the thirty-two redundancy lines for each bank. When the 16-bit normal address signal NORMAL_ADD<0:15> is inputted to the semiconductor memory device, sixteen fuse circuits are included in each fuse set of the repair address generation units 340 and 440. Therefore, a total number of the fuse circuits in the repair address generation units 340 and 440 is equal to 2048 (=128×16).

Since there are a number of the redundancy lines in each bank, a total number of fuse circuits in the repair address generation units 340 and 440 may be significant. As such, in the above described examples, the sizes of the repair address generation units 340 and 440 may be relatively large. Therefore, as will be described below, the number of the redundancy lines in each bank may be selected so that a total number of fuse circuits provided in the repair address generation units 340 and 440 is fixed regardless of variations in the number of the redundancy lines in each bank.

For example, consider a situation where a total of four banks BANK 0 to BANK 3 are provided in the semiconductor memory device and 32 redundancy lines are present in each bank. However, the repair address generation units 340 and 440 of the semiconductor memory device may only include sixty-four fixed fuse sets which can select 64 redundancy lines. Nonetheless, while the 64 fuse sets provided in the repair address generation units 340 and 440 do not correspond to redundancy lines of the banks BANK 0 to BANK 3 one to one, they may correspond to the one-hundred-twenty-eight (=32×4) redundancy lines of the four banks by using the fuse sets more flexibly. Therefore, although only the 64 redundancy lines among the 128 redundancy lines provided in the four banks may be selected, the sizes of the repair address generation units 340 and 440 can be fixed.

Although the detailed circuit diagrams of the fuse circuits included in the repair address generation units 340 and 440 are illustrated, the detailed configuration and operation thereof are apparent to a person of ordinary skill in the art, and thus, further description thereof is avoided.

Figure 6:
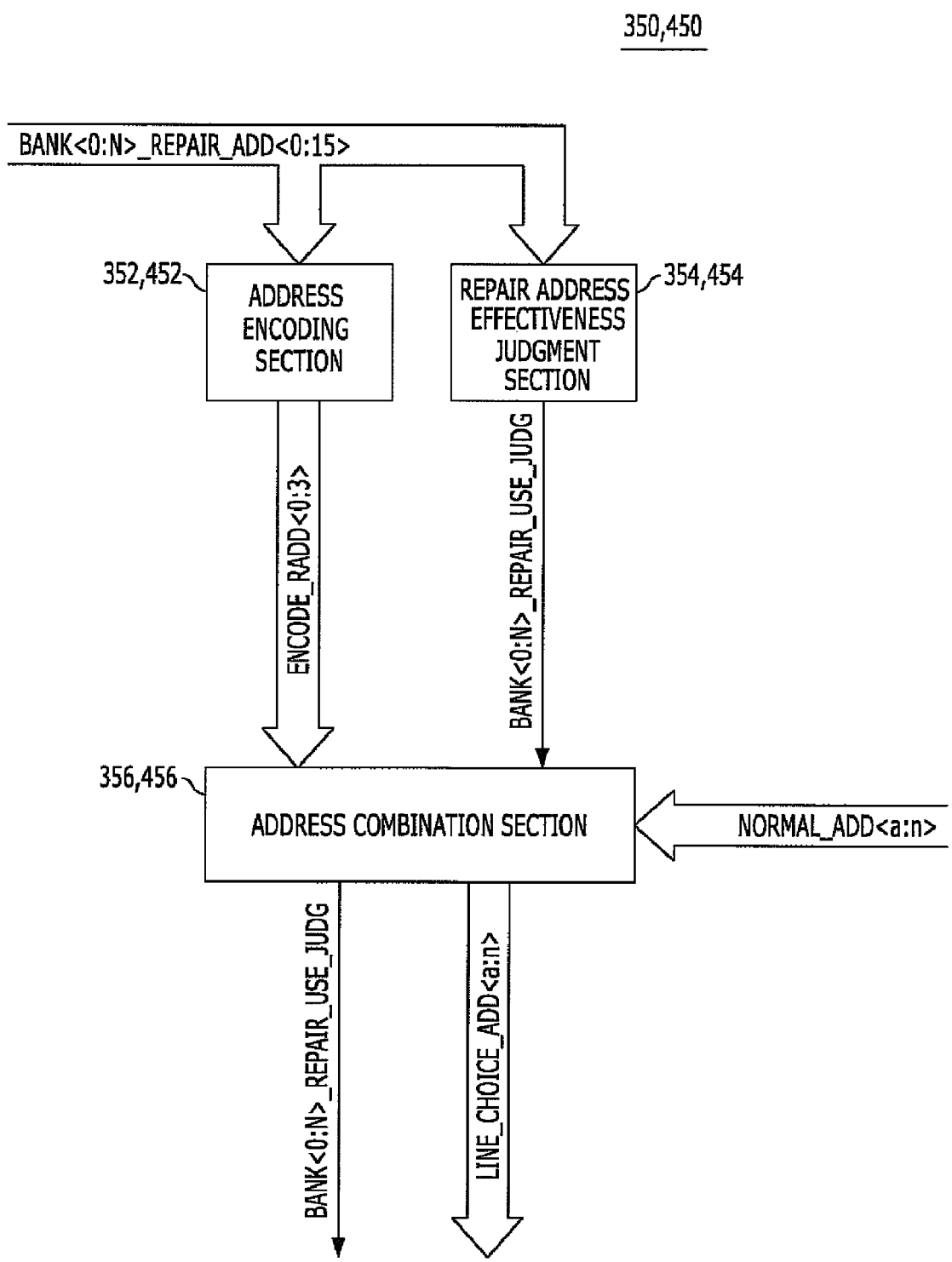
FIG. 6 is a block diagram illustrating line choice address generation units included in the semiconductor memory devices of FIGS. 3 and 4 in accordance with an exemplary embodiment of the present invention.

FIG. 6 is a block diagram illustrating the line choice address generation units included in the semiconductor memory devices of FIGS. 3 and 4 in accordance with an exemplary embodiment of the present invention.

Referring to FIG. 6, the line choice address generation units 350 and 450 included in the semiconductor memory devices in accordance with an exemplary embodiment of the present invention include address encoding sections 352 and 452, repair address use judgment sections 354 and 454, and address combination sections 356 and 456. The address encoding sections 352 and 452 are configured to encode the repair address signals BANK<0:N>_REPAIR_ADD<0:15> and output encoded repair address signals ENCODE_RADD<0:3>. The repair address use judgment sections 354 and 454 are configured to determine the value of the repair address use judgment signals BANK<0:N>_REPAIR_USE_JUDG in response to the activation of at least one bit among the bits of the repair address signals BANK<0:N>_REPAIR_ADD<0:15>. The address combination sections 356 and 456 are configured to generate the line choice address signals LINE_CHOICE_ADD<a:n> by combining the normal address signals NORMAL_ADD<a:n> and the output signals ENCODE_RADD<0:3> of the address encoding sections 352 and 452 according to the repair address use judgment signals BANK<0:N> REPAIR_USE_JUDG, and transfer the line choice address signals LINE_CHOICE_ADD<a:n> to the plurality of cell line decoding units 420 together with the repair address use judgment signals BANK<0:N>_REPAIR_USE_JUDG.

The address encoding sections 352 and 452 encode the multi-bit repair address signals BANK<0:N>_REPAIR_ADD<0:15> into compressed bits. In this case, the repair address signals BANK<0:N>_REPAIR_ADD<0:15> for the respective banks (BANK 0, BANK 1, ..., BANK N) 410 are encoded without bank designations.

For example, in the case of the repair address signals BANK<0:N>_REPAIR_ADD<0:15>, since 16-bit values exist in each of the banks (BANK 0, BANK 1, ..., BANK N) 410, the repair address signals BANK<0:N>_REPAIR_ADD<0:15> distinguished based on the banks (that is, designated for respective banks) will become a signal having a total of 16×N bits. However, when the 16-bit value is encoded into compressed bits in such a state that there is no distinction of the banks, only the 4-bit encoded repair address signal ENCODE_RADD<0:3> is required.

The repair address signals BANK<0:N>_REPAIR_ADD<0:15> distinguished based on the banks (BANK 0, BANK 1, ..., BANK N) 410 may be encoded without distinction of the banks because the address combination sections 356 and 456 generate the line choice address signals LINE_CHOICE_ADD<a:n> by combining the encoded repair address signals ENCODE_RADD<0:3> and the normal address signals NORMAL_ADD<a:n>. That is, since information for selecting the plurality of banks (BANK 0, BANK 1, ..., BANK N) 410 is contained in the normal address signals NORMAL_ADD<a:n> to be combined later, it is unnecessary to encode the repair address signals BANK<0:N>_REPAIR_ADD<0:15> in the encoding process with designations of respective banks.

The activation of a signal among the repair address signals BANK<0:N>_REPAIR_ADD<0:15> means that the value of the currently inputted normal address signals NORMAL_ADD<a:n> refers to the value for selecting the local cell lines BANK<0:N>_REPAIR_CELL_LINE<0:15> belonging to the redundancy cell region of one of the plurality of banks (BANK 0, BANK 1, ..., BANK N) 410. Therefore, the repair address use judgment sections 354 and 454 determine the value of the corresponding repair address use judgment signals BANK<0:N>_REPAIR_USE_JUDG in response to the activation of one of the repair address signals BANK<0:N>_REPAIR_ADD<0:15>.

In this case, the repair address use judgment signals BANK<0:N>_REPAIR_USE_JUDG are not signals which are combined with the normal address signals NORMAL_ADD<a:n> in the address combination sections 356 and 456, but signals to be applied based on the banks (BANK 0, BANK 1, ..., BANK N) 410. Hence, the repair address use judgment signals BANK<0:N>_REPAIR_USE_JUDG contain information for selecting the banks.

Therefore, when the value of the repair address use judgment signal BANK0_REPAIR_USE_JUDG corresponding to the zeroth bank BANK0 among the plurality of banks (BANK 0, BANK 1, ..., BANK N) 410 is activated, the repair address signal BANK0_REPAIR_ADD<0:15> corresponding to the bank BANK 0 among the repair address signals BANK<0:N>_REPAIR_ADD<0:15> is activated.

Likewise, when the value of the repair address use judgment signal BANK7_REPAIR_USE_JUDG corresponding to the bank BANK 7 among the plurality of banks (BANK 0, BANK 1, ..., BANK N) 410 is activated, the repair address signal BANK7_REPAIR_ADD<0:15> corresponding to the bank BANK7 among the repair address signals BANK<0:N>_REPAIR_ADD<0:15> is activated.

When the repair address use judgment signals BANK<0:N>_REPAIR_USE_JUDG are activated, the address combination sections 356 and 456 generate the line choice address signals LINE_CHOICE_ADD<a:n> by changing predefined bits among the multiple bits included in the normal address signals NORMAL_ADD<a:n> into the values corresponding to the output signals ENCODE_RADD<0:3> of the address encoding sections 352 and 452, and transfer the activated repair address use judgment signals BANK<0:N>_REPAIR_USE_JUDG to the plurality of cell line decoding units 420 together with the line choice address signals BANK<0:N>_LINE_CHOICE_ADD<a:n>.

In this manner, when the activated repair address use judgment signals BANK<0:N>_REPAIR_USE_JUDG are inputted to any one of the plurality of cell line decoding units 420, the cell line decoding unit 420 receiving the activated repair address use judgment signal BANK#_REPAIR_USE_JUDG selects one of the plurality of local cell lines BANK#_REPAIR_CELL_LINE<0:15> provided in the redundancy cell region of the bank BANK# corresponding to the line choice address signal BANK#_LINE_CHOICE_ADD<a:n> among the plurality of banks (BANK 0, BANK 1, . . . , BANK N) 410, in response to the values of predefined bits whose values are changed corresponding to the address encoding sections 352 and 452 among the multiple bits included in the line choice address signal BANK#_LINE_CHOICE_ADD<a:n>.

In addition, when the repair address use judgment signals BANK<0:N>_REPAIR_USE_JUDE are deactivated, the address combination sections 356 and 456 generate the line choice address signals LINE_CHOICE_ADD<a:n> whose bit values are identical to the normal address signals NORMAL_ADD<a:n>, and transfer the deactivated repair address use judgment signals BANK<0:N>_REPAIR_USE_JUDG to the plurality of cell line decoding units 420 together with the line choice address signals LINE_CHOICE_ADD<a:n>.

In this manner, when the deactivated repair address use judgment signals BANK<0:N>_REPAIR_USE_JUDG are inputted to one of the plurality of cell line decoding units 420, the cell line decoding unit 420 receiving the deactivated repair address use judgment signal BANK#_REPAIR_USE_JUDG selects one of the plurality of local cell lines BANK#_NORMAL_CELL_LINE<0:$2^N$> provided in the normal cell region of the bank BANK# corresponding to the line choice address signal BANK#_LINE_CHOICE_ADD<a:n> among the plurality of banks (BANK 0, BANK 1, . . . , BANK N) 410, in response to the values of all bits included in the line choice address signals BANK#_LINE_CHOICE_ADD<a:n>.

Figure 7:
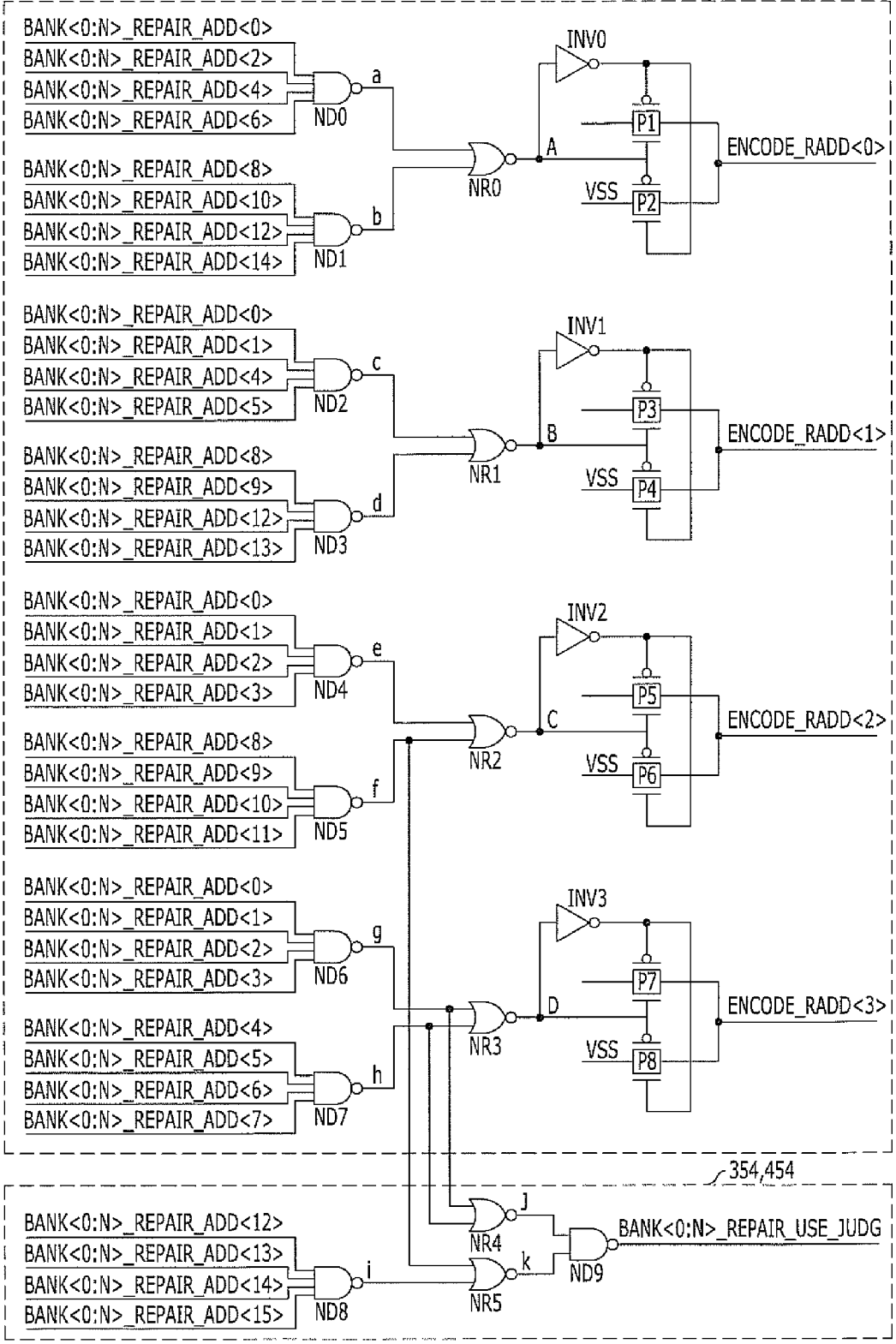
FIG. 7 is a detailed circuit diagram illustrating address encoding sections and repair address use judgment sections included in the line choice address generation unit of FIG. 6 in accordance with an exemplary embodiment of the present invention.

FIG. 7 is a detailed circuit diagram illustrating the address encoding sections and the repair address use judgment sections included in the line choice address generation unit of FIG. 6 in accordance with the embodiment of the present invention.

Referring to FIG. 7, as described above, the address encoding sections 352 and 452 included in the line choice address generation units 350 and 450 in accordance with an exemplary embodiment of the present invention encode the repair address signals BANK<0:N>_REPAIR_ADD<0:15> designated for respective banks (BANK 0, BANK 1, . . . , BANK N), where the encoded repair address signals no longer have such designations, and generate the encoded repair address signals ENCODE_RADD<0:3> having least bits.

The detailed operations can be easily understood with reference to Table 1 below.

TABLE 1

| | LINE_CHOICE_ADD<9> | LINE_CHOICE_ADD<10> | LINE_CHOICE_ADD<11> | LINE_CHOICE_ADD<12> | CORRESPONDING REDUNDANCY LINE |
|---|---|---|---|---|---|
| BANK<0:N>_REPAIR_ADD<0> | 0 | 0 | 0 | 0 | BANK<0:N>_REPAIR_CELL_LINE<0> |
| BANK<0:N>_REPAIR_ADD<1> | 1 | 0 | 0 | 0 | BANK<0:N>_REPAIR_CELL_LINE<1> |
| BANK<0:N>_REPAIR_ADD<2> | 0 | 1 | 0 | 0 | BANK<0:N>_REPAIR_CELL_LINE<2> |
| BANK<0:N>_REPAIR_ADD<3> | 1 | 1 | 0 | 0 | BANK<0:N>_REPAIR_CELL_LINE<3> |
| BANK<0:N>_REPAIR_ADD<4> | 0 | 0 | 1 | 0 | BANK<0:N>_REPAIR_CELL_LINE<4> |
| BANK<0:N>_REPAIR_ADD<5> | 1 | 0 | 1 | 0 | BANK<0:N>_REPAIR_CELL_LINE<5> |
| BANK<0:N>_REPAIR_ADD<6> | 0 | 1 | 1 | 0 | BANK<0:N>_REPAIR_CELL_LINE<6> |
| BANK<0:N>_REPAIR_ADD<7> | 1 | 1 | 1 | 0 | BANK<0:N>_REPAIR_CELL_LINE<7> |
| BANK<0:N>_REPAIR_ADD<8> | 0 | 0 | 0 | 1 | BANK<0:N>_REPAIR_CELL_LINE<8> |
| BANK<0:N>_REPAIR_ADD<9> | 1 | 0 | 0 | 1 | BANK<0:N>_REPAIR_CELL_LINE<9> |
| BANK<0:N>_REPAIR_ADD<10> | 0 | 1 | 0 | 1 | BANK<0:N>_REPAIR_CELL_LINE<10> |
| BANK<0:N>_REPAIR_ADD<11> | 1 | 1 | 0 | 1 | BANK<0:N>_REPAIR_CELL_LINE<11> |
| BANK<0:N>_REPAIR_ADD<12> | 0 | 0 | 1 | 1 | BANK<0:N>_REPAIR_CELL_LINE<12> |
| BANK<0:N>_REPAIR_ADD<13> | 1 | 0 | 1 | 1 | BANK<0:N>_REPAIR_CELL_LINE<13> |
| BANK<0:N>_REPAIR_ADD<14> | 0 | 1 | 1 | 1 | BANK<0:N>_REPAIR_CELL_LINE<14> |
| BANK<0:N>_REPAIR_ADD<15> | 1 | 1 | 1 | 1 | BANK<0:N>_REPAIR_CELL_LINE<15> |

Several specific examples will be described with reference to Table 1 above. In selecting the repair address signal BANK<0:N>_REPAIR_ADD<0> among the repair address signals BANK<0:N>_REPAIR_ADD<0:15>, all of the encoded repair address signals ENCODE_RADD<0:3> must become a logic low level.

In addition, in selecting the repair address signal BANK<0:N>_REPAIR_ADD<3> among the repair address signals BANK<0:N>_REPAIR_ADD<0:15>, the first and second bits BANK<0:N>_REPAIR_ADD<0> and BANK<0:N>_REPAIR_ADD<1> from the least significant bit (LSB) of the repair address signals BANK<0:N>_REPAIR_ADD<0:15> in the encoded repair address signals ENCODE_RADD<0:3> become a logic high level, and the remaining third and fourth bits BANK<0:N>_REPAIR_ADD<2> and BANK<0:N>_REPAIR_ADD<3> become a logic low level.

Likewise, in selecting the repair address signal BANK<0:N>_REPAIR_ADD<10> among the repair address signals BANK<0:N>_REPAIR_ADD<0:15>, the second and fourth bits BANK<0:N>_REPAIR_ADD<1> and BANK<0:N>_REPAIR_ADD<3> from the LSB of the repair address signals BANK<0:N>_REPAIR_ADD<0:15> in the encoded repair address signals ENCODE_RADD<0:3> become a logic high level, and the remaining first and third bits BANK<0:N>_REPAIR_ADD<0> and BANK<0:N>_REPAIR_ADD<2> become a logic low level.

Referring to FIG. 7, the address use judgment sections 354 and 454 included in the line choice address generation units 350 and 450 in accordance with the embodiment of the present invention receive the repair address signals BANK<0:N>_REPAIR_ADD<0:15> for each bit, and activate the address use judgment signals BANK<0:N>_REPAIR_USE_JUDG to a logic high level when one of the repair address signals BANK<0:N>_REPAIR_ADD<0:15> becomes a logic low level.

Since the address use judgment sections 345 and 454 are distinguishingly operated based on the banks (BANK 0, BANK 1, ..., BANK N) 410, they are operated in the following method.

First, when the normal address signals NORMAL_ADD<a:n> are inputted and one of the repair address signals BANK1_REPAIR_ADD<0:15> corresponding to the bank BANK 1 becomes a logic low level, the address use judgment signal BANK<1>_REPAIR_USE_JUDG corresponding to the bank BANK 1 changes to a logic high level, but the repair address signals BANK<0, 2:N>_REPAIR_ADD<0:15> corresponding to the remaining banks BANK 0, BANK 2, ..., BANK N maintain a logic high level. Therefore, the address use judgment signals BANK<0, 2:N>_REPAIR_USE_JUDG corresponding to the banks BANK 0, BANK 2, ..., BANK N maintain a logic low level.

Likewise, when the normal address signals NORMAL_ADD<a:n> are inputted and one of the repair address signals BANK7_REPAIR_ADD<0:15> corresponding to the bank BANK 7 becomes a logic low level, the address use judgment signal BANK<7>_REPAIR_USE_JUDG corresponding to the bank BANK 7 changes to a logic high level, but the repair address signals BANK<0:6, 8:N>_REPAIR_ADD<0:15> corresponding to the remaining banks BANK 0, ..., BANK 6, BANK 8, ..., BANK N maintain a logic high level. Therefore, the address use judgment signals BANK<0:6, 8:N>_REPAIR_USE_JUDG corresponding to the banks BANK 0, ..., BANK 6, BANK 8, ..., BANK N maintain a logic low level.

Figure 8:
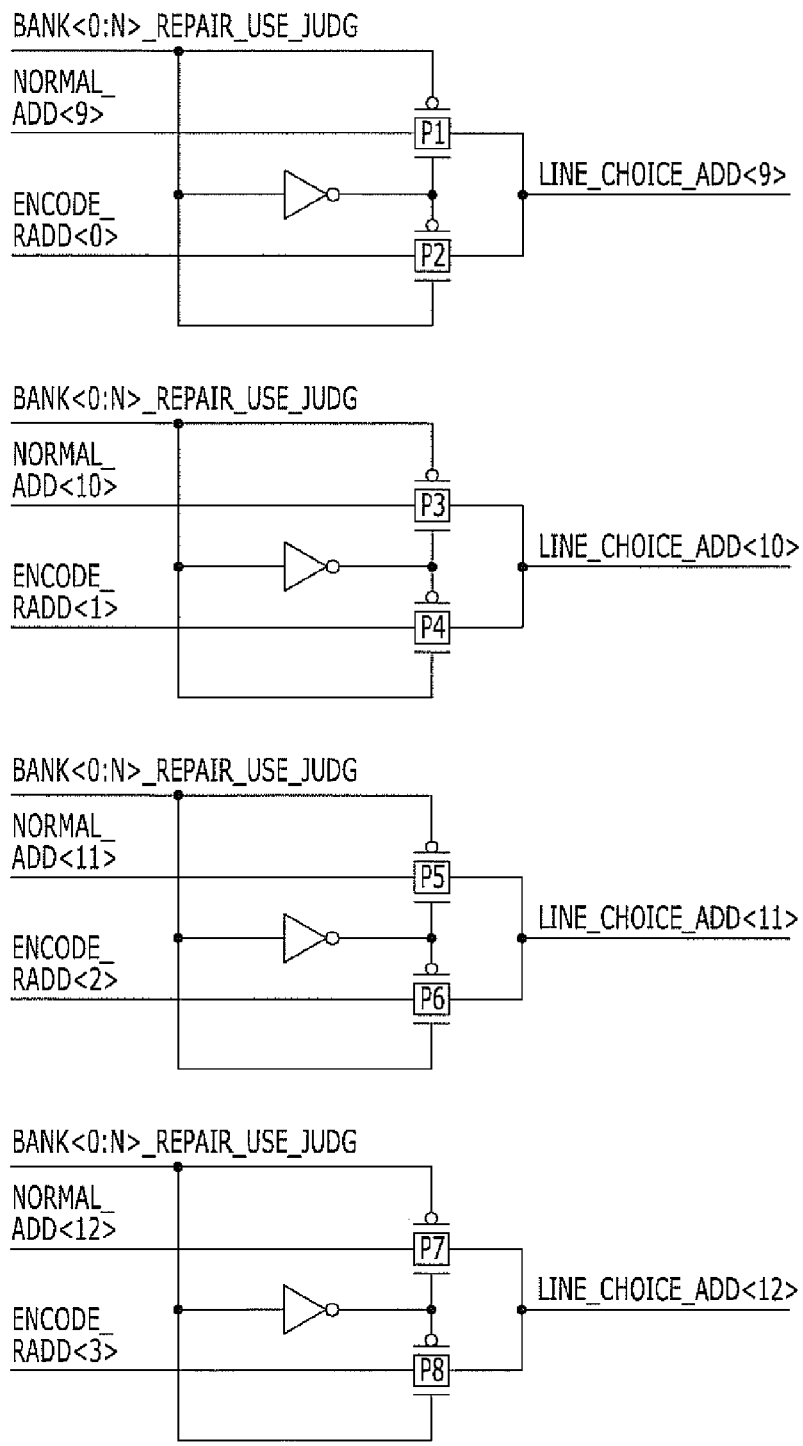
FIG. 8 is a detailed circuit diagram illustrating address combination sections included in the line choice address generation units of FIG. 6 in accordance with an exemplary embodiment of the present invention.

FIG. 8 is a detailed circuit diagram illustrating the address combination sections included in the line choice address generation units of FIG. 6 in accordance with the embodiment of the present invention.

Referring to FIG. 8, when one of the repair address use judgment signals BANK<0:N>_REPAIR_USE_JUDG is activated to a logic high, the address combination sections 356 and 456 included in the line choice address generation units 350 and 450 in accordance with an exemplary embodiment of the present invention generate the line choice address signals LINE_CHOICE_ADD<9:12> by changing several predefined bits NORMAL_ADD<9:12> among the multiple bits included in the normal address signals NORMAL_ADD<a:n> into the values corresponding to the output signals ENCODE_RADD<0:3> of the address encoding sections 352 and 452.

The normal address signals NORMAL_ADD<a:n> and the line choice address signals LINE_CHOICE_ADD<a:n> according to an example may be 16-bit signals NORMAL_ADD<0:15> and LINE_CHOICE_ADD<0:15>. Except for the bits LINE_CHOICE_ADD<9:12> whose values are changed corresponding to the output signals ENCODE_RADD<0:3> of the address encoding sections 352 and 452, the values of the remaining bits LINE_CHOICE_ADD<0:8, 13:15> are identical to the bit values of the corresponding normal address signals NORMAL_ADD<0:8, 13:15>.

When one of the repair address use judgment signals BANK<0:N>_REPAIR_USE_JUDG is deactivated, the address combination sections 356 and 456 generate the line choice address signals LINE_CHOICE_ADD<a:n> whose bit values are identical to the normal address signals NORMAL_ADD<a:n>.

That is, the output signals ENCODE_RADD<0:3> of the address encoding sections 352 and 452 are completely ignored.

In the above-described embodiments, the normal address signals NORMAL_ADD<a:n> can correspond to any address signal used in the semiconductor memory device.

For example, the normal address signals NORMAL_ADD<a:n> suggested in the foregoing embodiments may be row address signals used for selecting one of a plurality of word lines in a semiconductor memory device.

In case where the normal address signals NORMAL_ADD<a:n> are the row address signals, the cell regions of the banks provided in the semiconductor memory device are divided into the normal cell regions and the redundancy cell regions, centering on the word lines. The line choice address signals LINE_CHOICE_ADD<a:n> in accordance with the embodiment of the present invention may be used for selecting one of the plurality of word lines provided in the normal cell regions and the redundancy cell regions.

Likewise, the normal address signals NORMAL_ADD<a:n> suggested in the foregoing embodiments may be column address signals used for selecting one of a plurality of bit lines/bit bar lines in a general semiconductor memory device.

In case where the normal address signals NORMAL_ADD<a:n> are the column address signals, the cell regions of the banks provided in the semiconductor memory device are divided into the normal cell regions and the redundancy cell regions, centering on the bit lines/bit bar lines. The line choice address signals LINE_CHOICE_ADD<a:n> in accordance with the embodiment of the present invention may be used for selecting one of the plurality of bit lines/bit bar lines provided in the normal cell regions and the redundancy cell regions.

The normal address signals NORMAL_ADD<a:n> suggested in the foregoing embodiments may be both of the row address signals used for selecting one of the plurality of word lines and the column address signals used for selecting one of the plurality of bit lines/bit bar lines.

When the normal address signals NORMAL_ADD<a:n> are used as the row address signals and also used as the column address signals, the cell regions of the banks provided in the semiconductor memory device are divided into the normal cell regions and the redundancy cell regions, centering on the word lines, and simultaneously divided into the normal cell regions and the redundancy cell regions, centering on the bit lines/bit bar lines. Therefore, the line choice address signals LINE_CHOICE_ADD<a:n> in accordance with the embodiments of the present invention may be used for selecting one of the plurality of word lines provided in the normal cell regions and the redundancy cell regions, and, for example, simultaneously used for selecting one of the plurality of bit lines/bit bar lines provided in the normal cell regions and the redundancy cell regions.

In the exemplary embodiment of the present invention, one of the plurality of cell lines provided in the normal cell regions and the redundancy cell regions of the banks is selected by using the line choice address signals, which are generated by combining the normal address signals and the redundancy address signals within the semiconductor memory device and have the same bit number as that of the normal address signals. Therefore, the number of transmission lines for transmitting the address signals can be minimized/reduced.

Hence, the area occupied by the transmission lines for transmitting the address signals in the semiconductor memory device can be minimized/reduced.

Furthermore, since the transmission lines for transferring the address signals is minimized/reduced, the magnitude of the current consumed for transferring the address signals can be minimized/reduced.

In accordance with the exemplary embodiments of the present invention, the normal address signals and the redundancy address signals are combined within the semiconductor memory device including the normal cell regions and the redundancy cell regions, and the combined signals are transferred. Thus, the address signals can be transferred by using the minimum/reduced number of lines.

While the present invention has been described with respect to the specific embodiments, it will be apparent to those skilled in the art that various changes and modifications may be made without departing from the spirit and scope of the invention as defined in the following claims.

For example, although an embodiment with 16 redundancy cell lines in a single bank has been illustrated, the number of the redundancy cell lines may vary. In practice, a larger or smaller number of redundancy cell lines may be provided in a single bank.

Moreover, the positions and types of the logic gates and transistor set forth above may be differently implemented according to the polarities of the input signals.

What is claimed is:

1. A semiconductor memory device comprising:
a repair address generation unit configured to generate a repair address signal in response to a first address signal;
a line choice address generation unit configured to generate a line choice address signal by combining the first address signal and the repair address signal according to a determination as to whether the repair address signal is to be used; and
a cell line decoding unit configured to select one of a normal cell region and a redundancy cell region according to the determination and select one of a plurality of local cell lines provided in the selected cell region in response to the line choice address signal,
wherein the line choice address generation unit comprises:
an address encoding section configured to encode the repair address signal;
a repair address use judgment section configured to determine a value of a repair address use judgment signal in response to an activation of at least one bit among the respective bits of the repair address signal; and
an address combination section configured to combine the first address signal and an output signal of the address encoding section according to the repair address use judgment signal and generate the line choice address signal.

2. The semiconductor memory device of claim 1, wherein the repair address generation unit is configured to determine respective bit values of the repair address signal in response to the first address signal.

3. The semiconductor memory device of claim 1, wherein, when the repair address use judgment signal has an activated state, the address combination section is configured to generate the line choice address signal by changing a number of bits among multiple bits of the first address signal while leaving the remainder of the first address signal and output the combined bits as the line choice address signal.

4. The semiconductor memory device of claim 3, wherein, when the repair address use judgment signal is activated, the cell line decoding unit is configured to select one of the plurality of local cell lines provided in the redundancy cell region in response to the line choice address signal.

5. The semiconductor memory device of claim 1, wherein, when the repair address use judgment signal is deactivated, the address combination section is configured to output the first address signal as the line choice address signal.

6. The semiconductor memory device of claim 5, wherein, when the repair address use judgment signal is inputted in a deactivated state, the cell line decoding unit is configured to select one of the plurality of local cell lines provided in the normal cell region in response to the entire bits of the first address signal that is output as the line choice address signal.

7. The semiconductor memory device of claim 1, wherein the cell line decoding unit is disposed in a core region, and the repair address generation unit and the line choice address generation unit are disposed in a peripheral region.

8. A semiconductor memory device comprising:
a plurality of banks including normal cell regions and redundancy cell regions;
a repair address generation unit configured to generate a repair address signal in response to a first address signal;
a line choice address generation unit configured to generate a line choice address signal by combining the first address signal and the repair address signal according to a determination as to whether the repair address signal is to be used; and
a plurality of cell line decoding units configured to select one of the normal cell regions and the redundancy cell regions provided in the plurality of banks in response to the line choice address signal, and select one of a plurality of local cell lines provided in the selected cell region,
wherein the line choice address generation unit comprises:
an address encoding section configured to encode the repair address signal;
a repair address use judgment section configured to determine a value of a repair address use judgment signal in response to an activation of at least one bit among the respective bits of the repair address signal; and
an address combination section configured to generate the line choice address signal by combining the first address signal and an output signal of the address encoding section according to the repair address use judgment signal and transfer the line choice address signal to the plurality of cell line decoding units together with the repair address use judgment signal.

9. The semiconductor memory device of claim 8, wherein the repair address generation unit is configured to determine respective bit values of the repair address signal in response to the first address signal.

10. The semiconductor memory device of claim 8, wherein, when the repair address use judgment signal is activated, the address combination section is configured to generate the line choice address signal by changing a number of bits among multiple bits of the first address signal while leaving the remainder of the first address signal and output the combined bits as the line choice address signal.

11. The semiconductor memory device of claim 10, wherein, when the repair address use judgment signal is inputted in an activated state, each of the cell line decoding units is configured to select one of the plurality of local cell lines provided in the redundancy cell region of the bank corresponding to the line choice address signal among the plurality of banks in response to the line choice address signal.

12. The semiconductor memory device of claim 8, wherein, when the repair address use judgment signal is deactivated, the address combination section is configured to generate the line choice address signal having a value identical to the first address signal, and transfer the deactivated repair address use judgment signal to the plurality of cell line decoding units together with the line choice address signal.

13. The semiconductor memory device of claim 12, wherein, when the repair address use judgment signal is inputted in a deactivated state, each of the cell line decoding unit is configured to select one of the plurality of local cell lines provided in the normal cell region of the bank corresponding to the line choice address signal among the plurality of banks in response to the entire bits of the line choice address signal that is output as the line choice address signal.

14. The semiconductor memory device of claim 8, wherein the plurality of banks and the plurality of cell line decoding units are disposed in a core region, and the repair address generation unit and the line choice address generation unit are disposed in a peripheral region.

15. A method for operating a semiconductor memory device, the method comprising:
generating a repair address signal in response to a first address signal;
judging whether the repair address signal is to be used;
selectively driving a plurality of local cell lines provided in a redundancy cell region by using a line choice address signal generated by combining the first address signal and the repair address signal when it is determined that the repair address signal is to be used; and
selectively driving the plurality of local cell lines provided in the normal cell region by using the first address signal when it is determined that the repair address signal is not to be used,
wherein the judging of whether the repair address signal is to be used comprises determining a value of a repair address use judgment signal in response to an activation of at least one bit among the respective bits of the repair address signal.

16. The method of claim 15, wherein the generating of the repair address signal comprises determining respective bit values of the repair address signal in response to the first address signal.

17. The method of claim 15, wherein the selectively driving of the plurality of local cell lines provided in the redundancy cell region comprises:
encoding the repair address signal to generate the encoded repair address signal;
outputting the line choice address signal by changing a number of bits among multiple bits of the first address signal while leaving the remainder of the first address signal and output the combined bits as the line choice address signal, when the value of the repair address use judgment signal is activated; and
selectively driving the local cell line corresponding to the line choice address signal among the plurality of local cell lines provided in the redundancy cell region, when the value of the repair address use judgment signal is activated.

18. The method of claim 15, wherein the selectively driving of the plurality of local cell lines provided in the normal cell region comprises:
encoding the repair address signal to generate the encoded repair address signal;
outputting the first address signal as the line choice address signal, when the value of the repair address use judgment signal is deactivated; and
selectively driving the local cell line corresponding to the line choice address signal among the plurality of local cell lines provided in the normal cell region, when the value of the repair address use judgment signal is deactivated.

19. The method of claim 15, wherein the first address signal comprises a row address signal.

20. The method of claim 19, wherein the local cell line comprises a word line.

21. The method of claim 15, wherein the first address signal comprises a column address signal.

22. The method of claim 21, wherein the local cell line comprises a bit line.

* * * * *